(12) United States Patent
Kawakami et al.

(10) Patent No.: US 6,369,414 B2
(45) Date of Patent: *Apr. 9, 2002

(54) CHARGE COUPLED DEVICE HAVING CHARGE ACCUMULATING LAYER FREE FROM TOW-DIMENSIONAL EFFECT UNDER MINIATURIZATION AND PROCESS FOR FABRICATION THEREOF

(75) Inventors: Yukiya Kawakami; Shigeru Tohyama, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/451,770

(22) Filed: Dec. 1, 1999

(30) Foreign Application Priority Data

Dec. 7, 1998 (JP) .......................... 10-346460

(51) Int. Cl.⁷ ...................... H01L 27/768; H01L 27/148
(52) U.S. Cl. ........................ 257/224; 257/223; 257/231
(58) Field of Search .................. 257/216, 220, 257/222–224, 231

(56) References Cited

U.S. PATENT DOCUMENTS 4,654,682 A * 3/1987 Boudewijns ................ 257/223

FOREIGN PATENT DOCUMENTS

| JP | 53-69526 | 6/1978 |
| JP | 57-128959 | 8/1982 |
| JP | 60-187053 | 9/1985 |
| JP | 61-183958 | 8/1986 |
| JP | 05-335549 | 12/1993 |
| JP | 12-12828 | 1/2000 |

OTHER PUBLICATIONS

J.T. Bosiers et al., "Design Options for ¼–FT–CCD pixels", Proceedings of 1995 IEEE Workshop on Charge–Coupled Devices and Advanced Image Sensors, (Apr. 1995), pp. 1–5 with Abstract.

* cited by examiner

Primary Examiner—Gene M. Munson
(74) Attorney, Agent, or Firm—Sughrue Mion, PLLC

(57) ABSTRACT

A charge coupled device has an n-type charge accumulating layer equal to or less than 5 micron in width, and the unit cells suffer from reduction of signal charge accumulated therein and an increased pulse height of a pulse signal for a substrate shutter, wherein at least one p-type local impurity region is formed in such a manner as to form a p-n junction together with the n-type charge accumulating layer and the n-type semiconductor substrate, thereby increasing the amount of signal charge accumulated in each unit cell without sacrifice of the pulse height of the pulse signal for the substrate shutter.

6 Claims, 12 Drawing Sheets

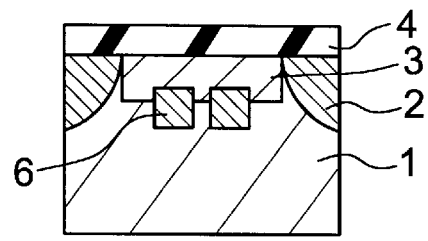
FIG. 8H
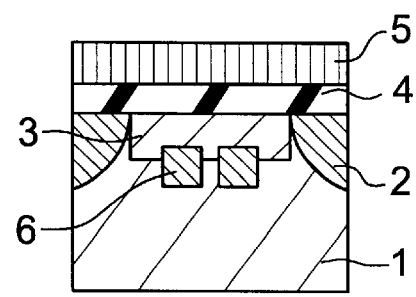
FIG. 8I
FIG. 1A
PRIOR ART
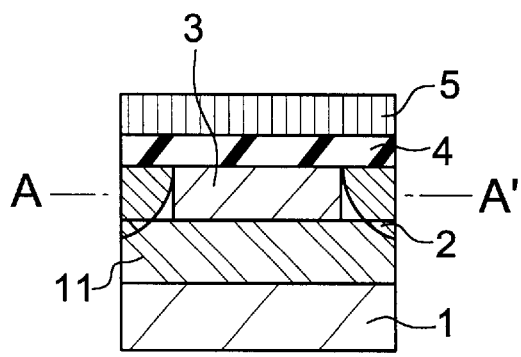
FIG. 1B
PRIOR ART
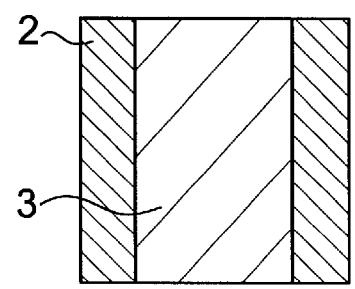

CHARGE COUPLED DEVICE HAVING CHARGE ACCUMULATING LAYER FREE FROM TOW-DIMENSIONAL EFFECT UNDER MINIATURIZATION AND PROCESS FOR FABRICATION THEREOF

FIELD OF THE INVENTION

This invention relates to a charge coupled device and, more particularly, to a charge coupled device having a miniature charge accumulating layer and a process for fabricating the charge coupled device.

DESCRIPTION OF THE RELATED ART

The charge coupled device has found a wide variety of application such as, for example, an image sensor. The charge coupled device used in the image sensor is categorized in a frame-transfer type, and has the structure shown in FIGS. 1A and 1B. The prior art frame-transfer type charge coupled device is fabricated on an n-type semiconductor substrate 1, and a p-type well 11 is formed in a surface portion of the n-type semiconductor substrate 1. P-type isolating regions 2 are spaced from each other in the p-type well 11, and n-type charge accumulating layer 3 is formed between the p-type isolating regions 2. The isolating regions 2 and the n-type charge accumulating layer 3 are covered with an insulating layer 4, and transfer electrodes 5 are patterned on the insulating layer 4 along the charge accumulating layer 3.

A driving pulse signal is selectively applied to the transfer electrodes 5. Then, potential wells are sequentially created in the charge accumulating layer 3 under the transfer electrodes 5, and charge packets are conveyed from the potential wells to the next potential wells. Signal charge forms each charge packet, and is representative of a piece of visual image. A part of the charge accumulating layer for creating a potential well and associated transfer electrode or electrodes 5 are hereinbelow referred to as "unit cell" which is a pixel of the frame-transfer type charge coupled device image sensor, also.

Though not shown in FIGS. 1A and 1B, a certain voltage is applied to the n-type substrate 1, and excess signal charge is discharged through the p-type well 11 to the n-type substrate 1. Thus, the adjacent potential wells are prevented from the excess charge. While the charge packets are being conveyed along the charge accumulating layer 3, the p-n junction between the n-type semiconductor substrate 1 and the p-type well 11 is reversely biased, and the p-type well 11 is electrically isolated from the n-type semiconductor substrate 1. When a pulse signal is applied to the n-type semiconductor substrate 1, the p-n junction is much stronger biased in reverse than ever, and the signal charge is discharged to the n-type semiconductor substrate 1. This phenomenon is called as a substrate shutter or an electronic shutter, and the exposure is controlled with the substrate shutter.

Users request the manufacturer to reduce the price of the image sensor. In order to reduce the production cost, the manufacturer scales down the image sensor and, accordingly, the charge coupled device. Another request for the manufacturer is a fine visual image on a screen, and the manufacturer increases the photo-electric converting elements per unit area. This means that the unit cell is miniaturized as well as the photo-electric converting element. Thus, the common concept for both approaches is miniaturization.

Research and development efforts have been made for a miniature unit cell, and it is found that the p-type well is not required for the unit cell. This means that the charge accumulating layer 3, the isolating regions 2 the insulating layer 4 and the transfer electrodes 5 form in combination a charge coupled device as shown in FIGS. 2A and 2B (see "Design Options for ¼"-FTCCD Pixels", J. T. Bosiers et. al., Proceedings of 1995 IEEE Workshop on Charge- Coupled Devices and Advanced Image Sensors, April, 1995). The prior art charge coupled device without the p-type well is simpler than the standard charge coupled device, and the production cost is reduced. However, the manufacturer encounters the following problems in the miniaturized charge coupled device. First, the isolating regions 2 increase influences on the charge accumulating layer 3, and the designer can not analyze the miniature unit cell as a one-dimensional model in the direction of the depth of the charge accumulating layer 3. Two-dimensional analysis is required for the miniature unit cell. The phenomenon which the designer experiences in the design work for the miniature unit cell is hereinbelow referred to as "two-dimensional effect".

In this situation, when the manufacturer designs the charge accumulating layer 3, the amount of actually accumulated signal charge is less than the amount of accumulated signal charge predicted on the basis of the ratio of areas. On the other hand, when the manufacturer designs the substrate shutter, the substrate shutter requires the pulse signal with a higher pulse height for discharging the signal charge to the substrate, because the pulse signal is expected to deplete the isolating regions 2 increased at the ratio of areas as well as the charge accumulating layer 3. If the dopant concentration of the charge accumulating layer 3 is increased, the amount of accumulated signal charge is increased. However, the substrate shutter requires a higher pulse height due to the charge accumulating layer 3 increased in the dopant concentration. The pulse height may exceed the maximum voltage level for portable electronic goods. Moreover, the higher pulse height is causative of increase of the electric power consumption. Thus, there is a trade-off between the increase of the amount of accumulated signal charge and the decrease of the pulse height of the pulse signal.

SUMMARY OF THE INVENTION

It is therefore an important object of the present invention to provide a charge coupled device, which has a unit cell increased in the amount of signal charge without sacrifice of the pulse height of a pulse signal used for a substrate shutter.

It is also an important object of the present invention to provide a process for fabricating the charge coupled device.

The present inventors contemplated the problems inherent in the prior art charge coupled device, and found that the dopant impurity concentration was different between a central region of a charge accumulating layer and a peripheral region thereof due to the diffusion of the dopant impurity. The peripheral region was relatively low in the dopant impurity concentration, and was liable to be depleted around the p-n junctions between the charge accumulating layer and the isolating regions. This resulted in that the peripheral region merely accumulated a small amount of signal charge. The two-dimensional effect was derived from the lightly-doped peripheral region.

The present inventors simulated the amount of accumulated charge per unit area for miniature charge accumulating layers, and plotted the amount of accumulated charge per unit area in FIG. 3. The present inventors concluded that the two-dimensional effect became serious in the charge coupled device with the charge accumulating layer equal in width to or less than 5 microns.

Subsequently, the present inventors considered how to restrict the two-dimensional effect. As described hereinbefore, the non-uniform dopant concentration was the origin of the two-dimensional effect. The present inventors made the charge accumulating layer higher in dopant impurity concentration in the peripheral region and lower in the central region. The higher the dopant impurity concentration, the more the amount of accumulated charge. The depletion layer extending from the p-n junction was relatively thin in the heavily-doped peripheral region. An approach to the heavily-doped peripheral region was formed by using a counter doping in the central region, which had been already heavily doped. An impurity region opposite in conductivity type to the central region was formed through the counter doping, and a p-n junction took place between the impurity region and the central region. The p-n junction was conducive to the increase of the amount of accumulated charge.

The reason for the high pulse height was that the electric lines of force were converged for depleting the heavily-doped isolating region as well as the charge accumulating layer. The present inventors considered that a protection for the isolating regions against the electric lines of force was effective against the increase of the pulse height. Otherwise, the electric lines of force had to be converged for depleting the charge accumulating layer before the isolating regions. The present inventors noticed that the p-n junction formed through the counter doping was available for the convergence of the electric lines of force. However, it is important to space the impurity region formed through the counter-doping from the isolating regions. Because the impurity region held in contact with the isolating regions merely prolonged the p-n junctions of the isolating regions. Thus, the impurity region formed through the counter doping was locally formed under the charge accumulating layer.

To accomplish the object, the present invention proposes to form an impurity region opposite in conductivity type to a charge accumulating layer locally under the charge accumulating layer.

In accordance with one aspect of the present invention, there is provided a charge coupled device fabricated on a semiconductor substrate of a first conductivity type isolating regions having a second conductivity type opposite to the first conductivity type and spaced from each other in a surface portion of the semiconductor substrate, a charge accumulating layer of the first conductivity type formed in the surface portion between the isolating regions, an insulating layer formed on the isolating regions and the charge accumulating layer, transfer electrodes formed on the insulating layer along the charge accumulating layer and a local impurity region of the second conductivity type formed in the semiconductor substrate, projecting into a central region of the charge accumulating layer for forming a p-n junction and spaced from the isolating regions.

In accordance with another aspect of the present invention, there is provided a process for fabricating a charge coupled device comprising the steps of a) preparing a semiconductor substrate of a first conductivity type covered with an insulating layer, b) introducing a first dopant impurity into a surface portion of the semiconductor substrate for forming a charge accumulating layer of the first conductivity type, c) introducing a second dopant impurity purity into surface portions of the semiconductor substrate on both sides of the surface portion for forming isolating regions of a second conductivity type opposite to the first conductivity type, d) introducing a third dopant impurity into a region of the semiconductor substrate for forming a local impurity region of the second conductivity type projecting into a central region of the charge accumulating layer and spaced from the isolating regions and e) forming transfer electrodes over the charge accumulating layer.

BRIEF DESCRIPTION OF THE DRAWINGS

The features and advantages of the charge coupled device and the process will be more clearly understood from the following description taken in conjunction with the accompanying drawings in which:

FIG. 1A is a cross sectional view showing the prior art frame-transfer type charge coupled device;

FIG. 1B is a cross sectional view taken along line A–A' in FIG. 1A and showing the charge accumulating layer located between the isolating regions;

FIGS. 8A to 8I are cross sectional views showing essential steps of yet another process for fabricating a charge coupled device according to the present invention.

DESCRIPTION OF THE PREFERRED EMBODIMENTS

Structure of Charge Coupled Device
First Embodiment

Figure 4A:
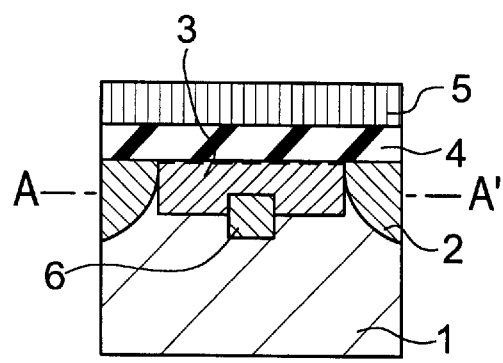
FIG. 4A is a cross sectional view showing the structure of a unit cell incorporated in a charge coupled device according to the present invention.
Figure 4B:
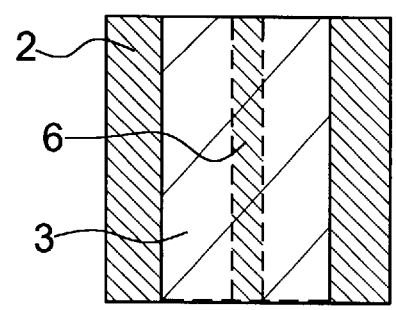
FIG. 4B is a cross sectional view taken along A–A' in FIG. 4A and showing the location of a local impurity region under a charge accumulating layer.

Referring to FIGS. 4A and 4B of the drawings, a charge coupled device embodying the present invention is fabricated on an n-type semiconductor substrate 1. Heavily-doped p-type isolating regions 2 are formed in surface portions of the n-type semiconductor substrate 1, and are spaced from each other. Between the heavily-doped p-type isolating regions 2 is formed a heavily-doped n-type charge accumulating layer 3 which is equal to or less than 5 microns in width. The n-type charge accumulating layer 3 and the heavily-doped p-type isolating regions 2 are covered with an insulating layer 4, and transfer electrodes 5 are patterned on the isolating layer 4 along the n-type charge accumulating layer 3. A p-type local impurity region 6 projects into a central region of the n-type charge accumulating layer 3 and the n-type semiconductor substrate 1. The p-type local impurity region 6 is narrower than the n-type charge accumulating layer 3, and, accordingly, is spaced from the heavily-doped p-type isolating regions 2. The p-type local impurity region 6 extends along the n-type charge accumulating layer 3, and keeps the width constant in the longitudinal direction thereof. The width of the p-type local impurity region 6 is equal to or less than a half of the distance between the heavily-doped p-type isolating regions 2. The location of the p-type local impurity region 6 is indicated by hatching lines in FIG. 4B for easily discrimination.

In this instance, the p-n junction between the n-type semiconductor substrate 1 and the heavily doped p-type isolation region 2 is reversely biased with certain voltage which controls accumulated charge, i.e., there is no accumulated charge in excess bias voltage. Then, a shutter operation as an exposure time limitation is realized by controlling duty ratio between normal bias voltage applying-time and excess bias voltage applying-time in which there is no accumulated charge. The excess bias voltage is achieved by adding a pulse signal voltage with the normal bias voltage, i.e., the pulse signal is applied to the n-type semiconductor substrate 1. The n-type semiconductor substrate 1 is doped at $1 \times 10^{14}$ to $1 \times 10^{15}$ atoms/cm$^3$. The central region of the n-type charge accumulating layer 3 is doped at $1 \times 10^{15}$ to $1 \times 10^{18}$ atoms/cm$^3$, and the peripheral region of the n-type charge accumulating layer 3 is doped at $1 \times 10^{15}$ to $1 \times 10^{18}$ atoms/cm$^3$ The heavily-doped p-type isolating regions 2 are doped at $1 \times 10^{18}$ to $1 \times 10^{20}$ atoms/cm$^3$, and the p-type local impurity region 6 is doped at $1 \times 10^{15}$ to $1 \times 10^{17}$ atoms/cm$^3$.

The heavily-doped n-type charge accumulating layer 3 has peripheral regions heavily-doped with the n-type dopant impurity, and the p-type local impurity region 6 forms a p-n junction together with the heavily-doped n-type charge accumulating layer 3 and the n-type semiconductor substrate 1. The heavily-doped peripheral regions and the p-n junction increase the amount of signal charge accumulated in each unit cell. Moreover, the p-n junction of the p-type local impurity region 6 is depleted with electric lines of force from the n-type semiconductor substrate 1 earlier than the p-n junctions of the heavily-doped p-type isolating regions 2, and a high pulse height is not required for a pulse signal for the substrate shutter.

Second Embodiment

Figure 5A:
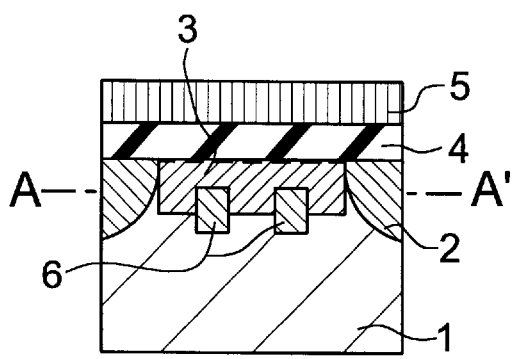
FIG. 5A is a cross sectional view showing the structure of a unit cell incorporated in another charge coupled device according to the present invention.
Figure 5B:
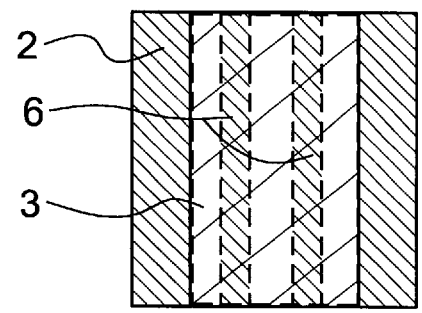
FIG. 5B is a cross sectional view taken along A–A' in FIG. 5A and showing the locations of two local impurity regions under a charge accumulating layer.

Turning to FIGS. 5A and 5B, another charge coupled device embodying the present invention is fabricated on an n-type semiconductor substrate 1. Heavily-doped p-type isolating regions 2 are formed in surface portions of the n-type semiconductor substrate 1, and are spaced from each other. Between the heavily-doped p-type isolating regions 2 is formed a heavily-doped n-type charge accumulating layer 3 which is equal to 5 microns in width. The n-type charge accumulating layer 3 and the heavily-doped p-type isolating regions 2 are covered with an insulating layer 4, and transfer electrodes 5 are patterned on the isolating layer 4 along the n-type charge accumulating layer 3. A pair of p-type local impurity regions 6 projects into a central region of the n-type charge accumulating layer 3 and the n-type semiconductor substrate 1. Each of the p-type local impurity regions 6 are narrower than the n-type charge accumulating layer 3, and, accordingly, the p-type local impurity regions are spaced from the heavily-doped p-type isolating regions 2. The p-type local impurity regions 6 extend in parallel along the n-type charge accumulating layer 3, and are constant in width. The location of the p-type local impurity regions 6 is indicated by hatching lines in FIG. 5B for easily discrimination. The charge accumulating layer 3 is as wide as 5 microns, and the two-dimensional effect is not so strong. However, the pair of p-type local impurity regions 6 increases the amount of signal charge accumulated in each unit cell, and restricts the pulse height of the pulse signal for the substrate shutter.

Process of Fabrication

Figure 2A:
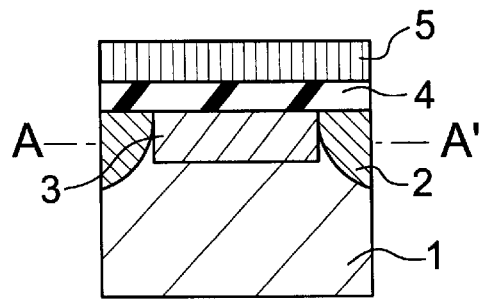
FIG. 2A is a cross sectional view showing the prior art frame-transfer type charge coupled device fabricated without a p-type well.
Figure 2B:
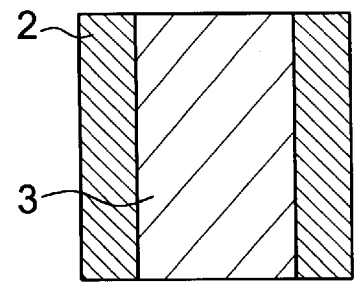
FIG. 2B is a cross sectional view taken along line A–A' in FIG. 2A and showing the charge accumulating layer located between the isolating regions.
Figure 3:
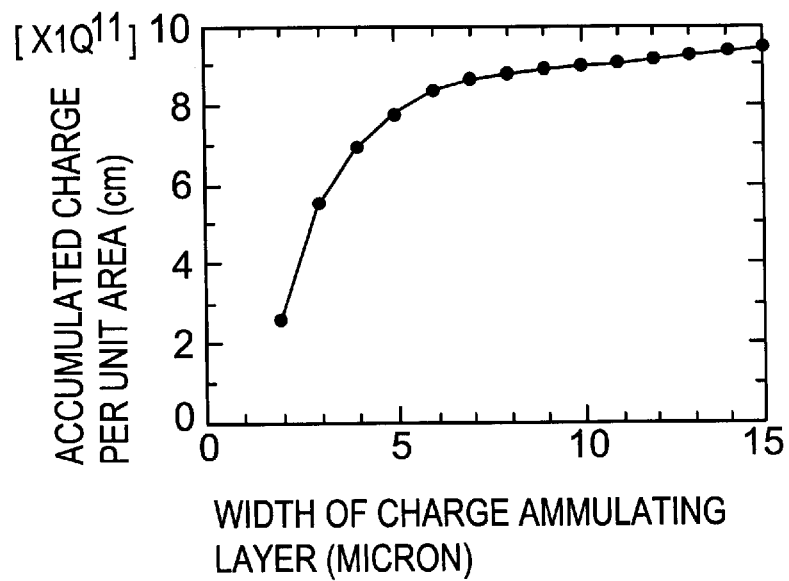
FIG. 3 is a graph showing a relation between the amount of accumulated charge per unit area and the width of a charge accumulating layer.

FIGS. 6A to 6G illustrate a process for fabricating the charge coupled device shown in FIGS. 3A and 3B. The process starts with preparation of the n-type semiconductor substrate 1 such as, for example, an n-type single crystalline silicon substrate. Insulating material such as silicon oxide is grown on the major surface of the n-type semiconductor substrate 1, and forms an insulating layer 4. Photo-resist solution is spread over the entire surface of the insulating layer 4, and is baked so as to cover the insulating layer 4 with a photo-resist layer. A pattern image for the n-type charge accumulating layer 3 is transferred from a photo-mask (not shown) to the photo-resist layer, and forms a latent image in the photo-resist layer. The latent image is developed, and a photo-resist ion-implantation mask 7 is left on the insulating layer 4. Thus, the photo-resist ion-implantation mask 7 is patterned on the insulating layer 4 through a photo-lithography.

Figure 6A:
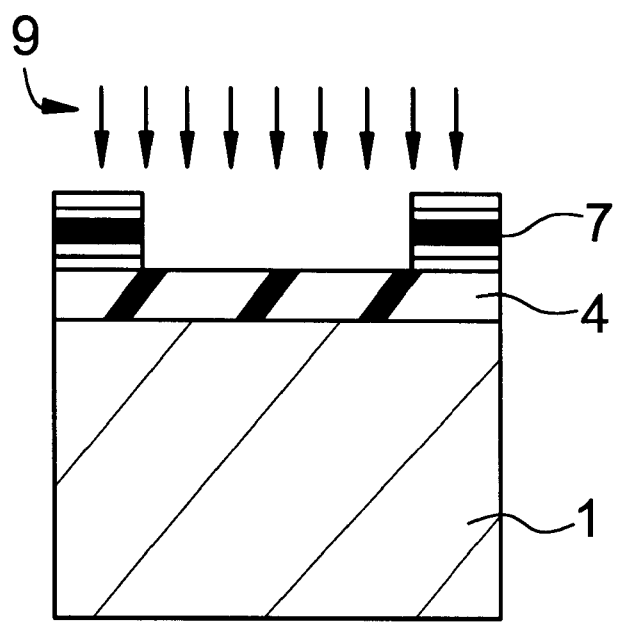
FIGS. 6A to 6G are cross sectional views showing essential steps of a process for fabricating a charge coupled device according to the present invention.

Using the photo-resist ion-implantation mask 7, n-type dopant impurity 9 such as, for example, phosphorous is implanted into the n-type semiconductor substrate 1 at dosage of $5 \times 10^{11}$ to $1 \times 10^{13}$ under acceleration energy of 50 to 200 keV as shown in FIG. 6A.

Figure 6B:
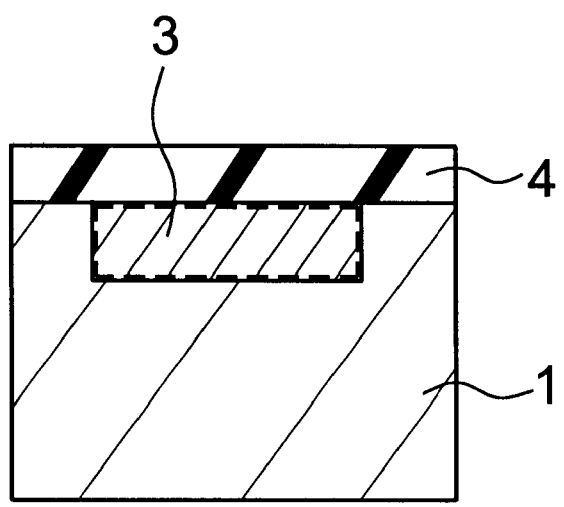

The n-type dopant impurity 9 forms the n-type charge accumulating layer 3 in the surface portion of the n-type semiconductor substrate 1. The photo-resist ion-implantation mask 7 is stripped off, and the n-type dopant impurity is activated through an appropriate annealing. Thus, the n-type charge accumulating layer 3 is formed in the surface portion of the n-type semiconductor substrate 1 as shown in FIG. 6B.

Figure 6C:
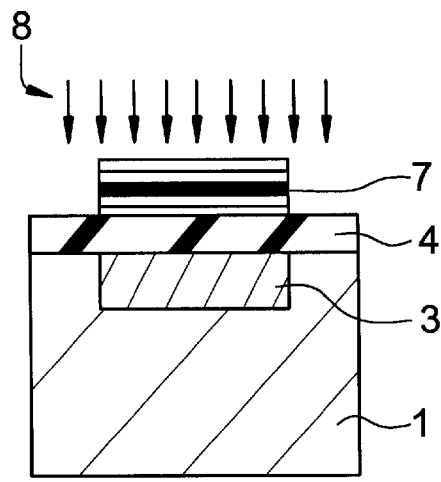

Subsequently, another photo-resist ion-implantation mask 7 is formed on the insulating layer 4 through the photo-lithography, and p-type dopant impurity 8 such as, for example, boron is ion implanted into the surface portion of the n-type semiconductor substrate 1 at dosage of $5 \times 10^{11}$ to $1 \times 10^{13}$ under the acceleration energy of 20 to 200 keV as shown in FIG. 6C.

Figure 6D:
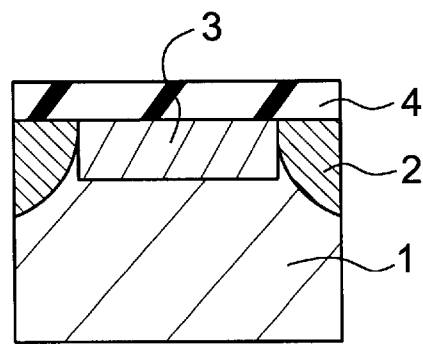

The photo-resist ion-implantation mask 7 is stripped off. The p-type dopant impurity is activated through an appropriate annealing, and forms the heavily-doped p-type isolating regions 2 on both sides of the n-type charge accumulating layer 3 as shown in FIG. 6D.

Figure 6E:
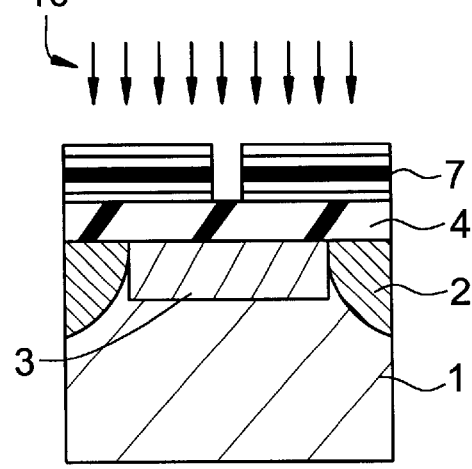

Subsequently, yet another photo-resist ion-implantation mask 7 is patterned on the insulating layer 4 through the photo-lithography, and p-type dopant impurity 10 is ion implanted into the surface portion of the n-type semiconductor substrate 1 at dosage of $5 \times 10^{11}$ to $1 \times 10^{13}$ under the acceleration energy of 50 to 200 keV as shown in FIG. 6E.

Figure 6F:
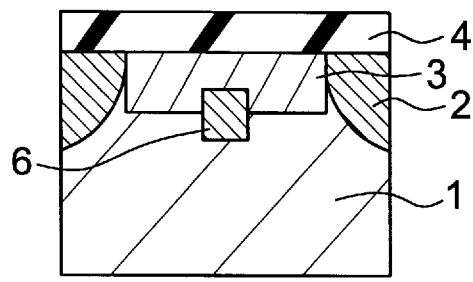

The photo-resist ion-implantation mask 7 is stripped off, and the ion-implanted p-type dopant impurity 10 forms the p-type local impurity region 6 as shown in FIG. 6F.

Figure 6G:
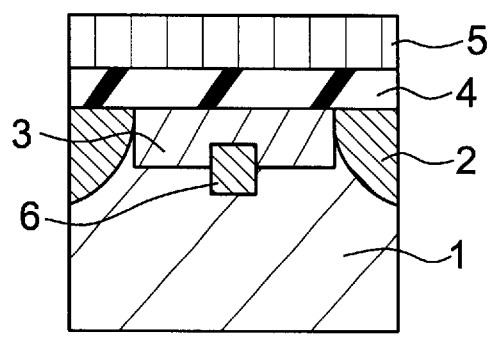

Conductive material is deposited over the entire surface of the resultant structure, and forms a conductive layer extending over the insulating layer 4. A photo-resist etching mask is patterned on the conductive layer through the photo-lithography, and an appropriate etchant selectively removes the conductive material from the conductive layer. As a result, the transfer electrodes 5 are left on the insulating layer 4 as shown in FIG. 6G.

As will be understood from the foregoing description, the n-type charge accumulating layer 3 is formed through the heavy doping, which is followed by the ion-implantation with the p-type dopant impurity 10. This results in the heavily-doped peripheral regions of the n-type charge accumulating layer 3 and the p-n junction penetrating into both of the central region and the n-type semiconductor substrate 1. The heavily-doped n-type peripheral regions and the p-n junction increase the amount of signal charge accumulated in each unit cell, and restrict the pulse height of the pulse signal for the substrate shutter.

Figure 7A:
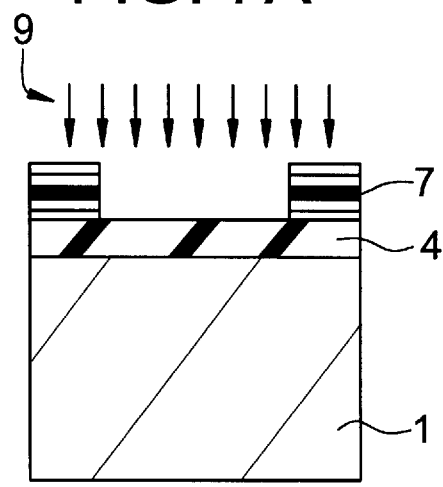
FIGS. 7A to 7I are cross sectional views showing essential steps of another process for fabricating a charge coupled device according to the present invention.

Turning to FIGS. 7A to 7I of the drawings, the charge coupled device shown in FIGS. 4A and 4B is fabricated as follows. The process starts with preparation of the n-type semiconductor substrate 1. Insulating material such as silicon oxide is grown on the major surface of the n-type semiconductor substrate 1, and forms an insulating layer 4. A photo-resist ion-implantation mask 7 is patterned on the insulating layer 4 through a photo-lithography. Using the photo-resist ion-implantation mask 7, n-type dopant impurity 9 is implanted into the n-type semiconductor substrate 1 at dosage of $5 \times 10^{11}$ to $1 \times 10^{13}$ under acceleration energy of 50 to 200 keV as shown in FIG. 7A.

Figure 7B:
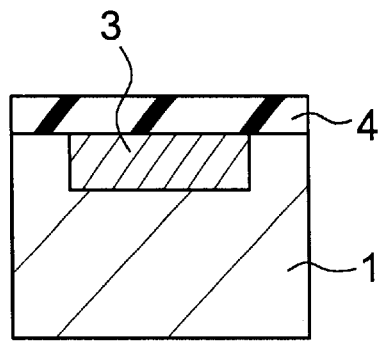

The n-type dopant impurity 9 forms the n-type charge accumulating layer 3 in the surface portion of the n-type semiconductor substrate 1. The photo-resist ion-implantation mask 7 is stripped off, and the n-type dopant impurity is activated through an appropriate annealing. Thus, the n-type charge accumulating layer 3 is formed in the surface portion of the n-type semiconductor substrate 1 as shown in FIG. 7B.

Figure 7C:
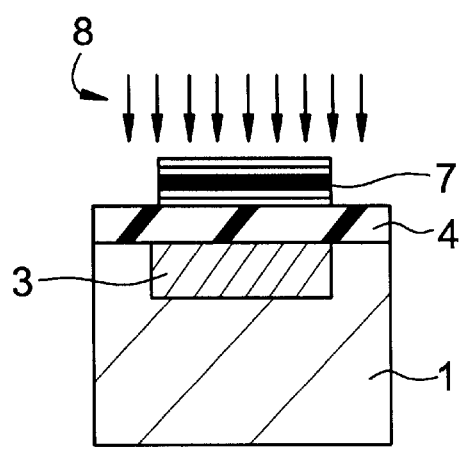

Subsequently, another photo-resist ion-implantation mask 7 is formed on the insulating layer 4 through the photo-lithography, and p-type dopant impurity 8 is ion implanted into the surface portion of the n-type semiconductor substrate 1 at dosage of $5 \times 10^{11}$ to $1 \times 10^{13}$ under the acceleration energy of 20 to 200 keV as shown in FIG. 7C.

Figure 7D:
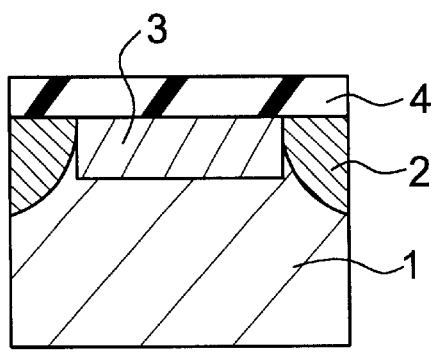

The photo-resist ion-implantation mask 7 is stripped off. The p-type dopant impurity is activated through an appropriate annealing, and forms the heavily-doped p-type isolating regions 2 on both sides of the n-type charge accumulating layer 3 as shown in FIG. 7D.

Figure 7E:
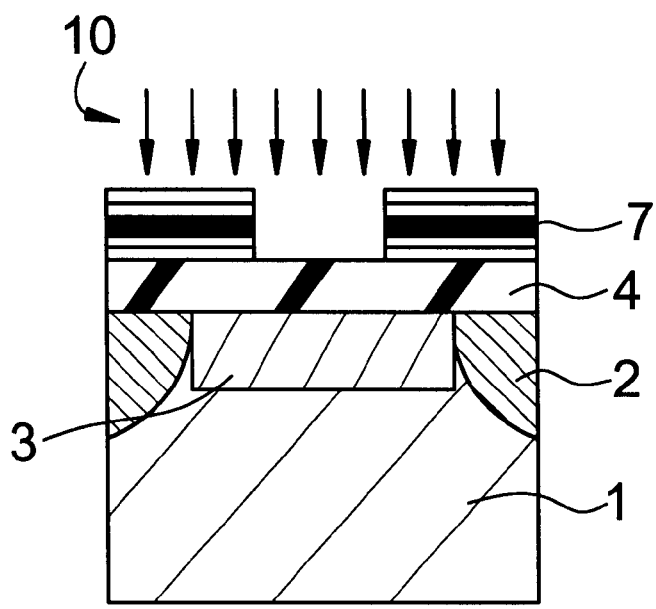

Subsequently, yet another photo-resist ion-implantation mask 7 is patterned on the insulating layer 4 through the photo-lithography, and has an opening over the central region of the n-type charge accumulating layer 3. The p-type dopant impurity 10 is ion implanted into the n-type semiconductor substrate 1 at dosage of $5 \times 10^{11}$ to $1 \times 10^{12}$ under the acceleration energy of 50 to 200 keV as shown in FIG. 7E.

Figure 7F:
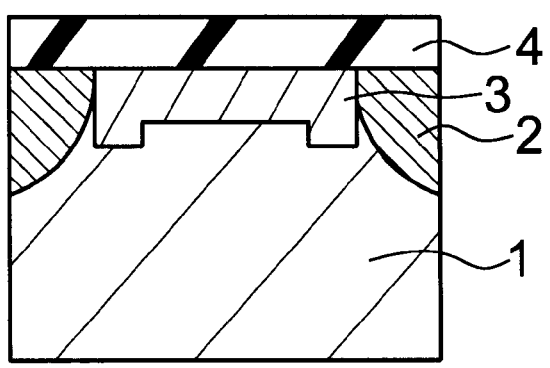

The p-type dopant impurity 10 makes the dopant impurity concentration in the central region of the n-type charge accumulating layer 3 low. The photo-resist ion-implantation mask 7 is stripped off, and the central region of the n-type charge accumulating layer 3 becomes thinner than the peripheral regions due to the p-type dopant impurity 10 as shown in FIG. 7F.

Figure 7G:
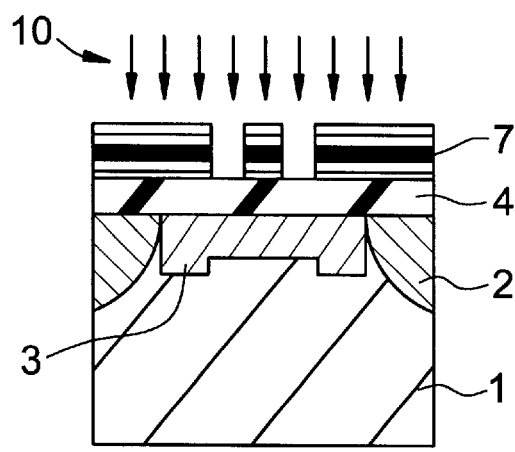

Subsequently, still another photo-resist ion-implantation mask 7 is patterned on the insulating layer 4, and has two elongated openings located in parallel over the central region of the n-type charge accumulating layer 3. The p-type dopant impurity 10 is ion implanted through the photo-resist ion-implantation mask 7 into the n-type semiconductor substrate 1 at dosage of $5 \times 10^{11}$ to $1 \times 10^{13}$ under the acceleration energy of 50 to 200 keV as shown in FIG. 7G.

Figure 7H:
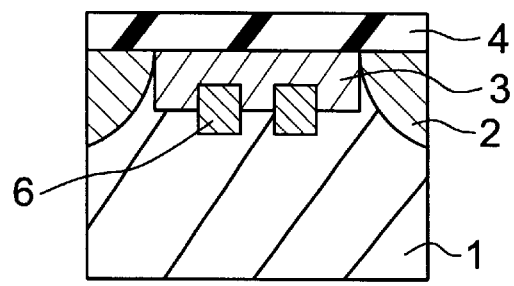

The photo-resist ion-implantation mask 7 is stripped off, and the p-type dopant impurity 10 forms the pair of p-type local impurity regions 6 as shown in FIG. 7H. The central region of the n-type charge accumulating layer 3 has been already decreased in dopant impurity concentration, and, accordingly, the p-type local impurity regions 6 have a high dopant impurity concentration.

Figure 7I:
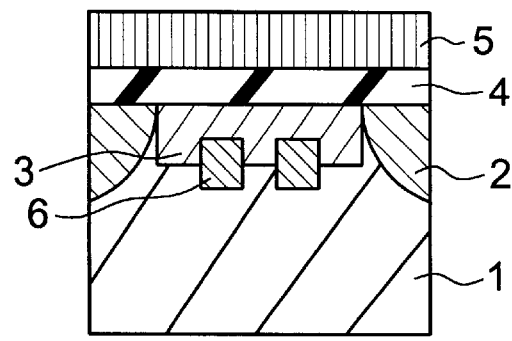

Conductive material is deposited over the entire surface of the resultant structure, and forms a conductive layer extending over the insulating layer 4. A photo-resist etching mask is patterned on the conductive layer through the photo-lithography, and an appropriate etchant selectively removes the conductive material from the conductive layer. As a result, the transfer electrodes 5 are left on the insulating layer 4 as shown in FIG. 7I.

As will be understood from the foregoing description, the n-type charge accumulating layer 3 is formed through the heavy doping, which is followed by the ion-implantations with the p-type dopant impurity 10. This results in the heavily-doped peripheral regions of the n-type charge accumulating layer 3 and the p-n junctions penetrating into both of the central region and the n-type semiconductor substrate 1. The heavily-doped n-type peripheral regions and the p-n junctions increase the amount of signal charge accumulated in each unit cell, and restrict the pulse height of the pulse signal for the substrate shutter. Even though the n-type charge accumulating layer 3 is as wide as 5 microns, the pair of p-type local impurity regions 6 offers the p-n junction long enough to increase the amount of signal charge accumulated in each unit cell.

Figure 8A:
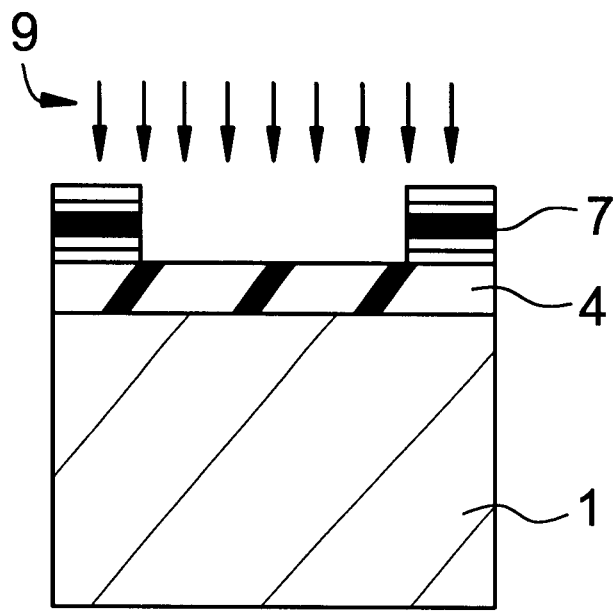

FIGS. 8A to 8I illustrate another process for fabricating the charge coupled device shown in FIGS. 4A and 4B. The process starts with preparation of the n-type semiconductor substrate 1. Insulating material such as silicon oxide is grown on the major surface of the n-type semiconductor substrate 1, and forms an insulating layer 4. A photo-resist ion-implantation mask 7 is patterned on the insulating layer 4 through a photo-lithography. Using the photo-resist ion-implantation mask 7, n-type dopant impurity 9 is implanted into the n-type semiconductor substrate 1 at dosage of $5 \times 10^{11}$ to $1 \times 10^{13}$ under acceleration energy of 50 to 200 keV as shown in FIG. 8A.

Figure 8B:
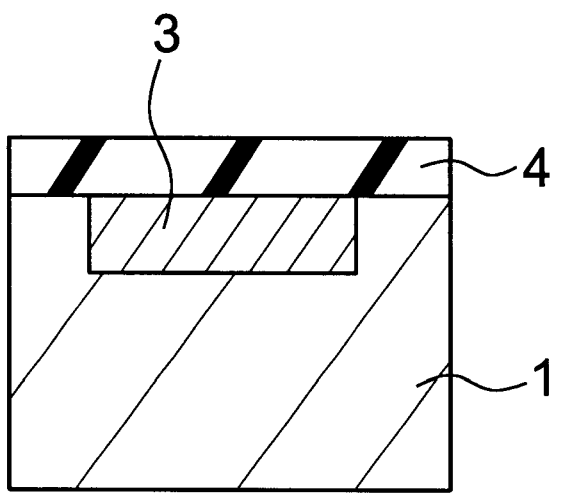

The photo-resist ion-implantation mask 7 is stripped off, and the n-type dopant impurity 9 forms the n-type charge accumulating layer 3 in the surface portion of the n-type semiconductor substrate 1 as shown in FIG. 8B.

Figure 8C:
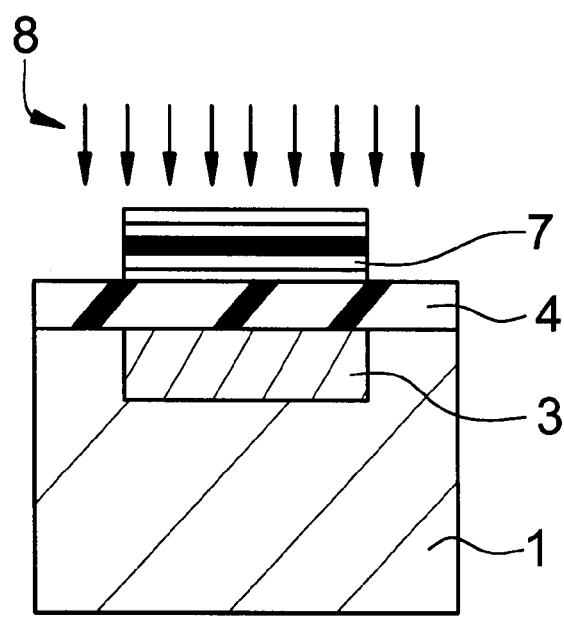

Subsequently, another photo-resist ion-implantation mask 7 is formed on the insulating layer 4 through the photo-lithography, and p-type dopant impurity 8 is ion implanted into the surface portion of the n-type semiconductor substrate 1 at dosage of $5 \times 10^{11}$ to $1 \times 10^{13}$ under the acceleration energy of 20 to 200 keV as shown in FIG. 8C.

Figure 8D:
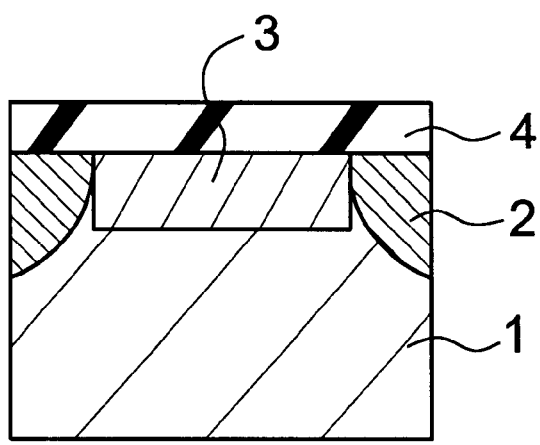

The photo-resist ion-implantation mask 7 is stripped off. The p-type dopant impurity 8 forms the heavily-doped p-type isolating regions 2 on both sides of the n-type charge accumulating layer 3 as shown in FIG. 8D.

Figure 8E:
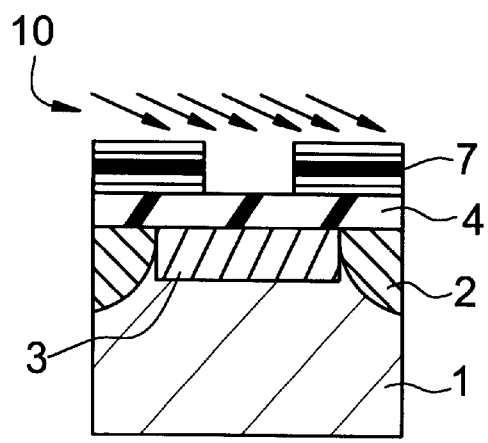

Subsequently, yet another photo-resist ion-implantation mask 7 is patterned on the insulating layer 4 through the photo-lithography, and has an opening over the central region of the n-type charge accumulating layer 3. The p-type dopant impurity 10 is obliquely ion implanted into the n-type semiconductor substrate 1 at dosage of $5 \times 10^{11}$ to $1 \times 10^{13}$ under the acceleration energy of 50 to 200 keV as shown in FIG. 8E. The direction of ion-implantation is from 10 to 60 degrees with respect to a normal line to the major surface of the n-type semiconductor substrate 1. The photo-resist ion-implantation mask 7 offers shade in the area exposed to the opening thereof, and the p-type dopant impurity 10 is not introduced into the n-type semiconductor substrate 1 under the shade.

Figure 8F:
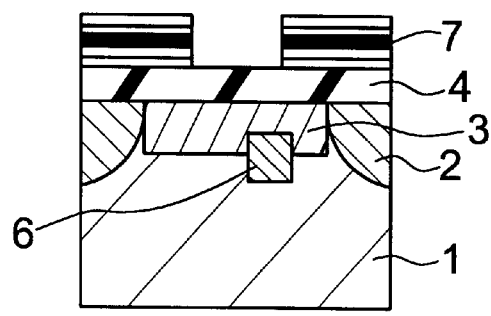

The p-type local impurity region 6 is formed in the right portion of the central region of the n-type charge accumulating layer 3 as shown in FIG. 8F. The p-type local impurity region 6 is narrower than the opening of the photo-resist ion-implantation mask 7. Thus, the extremely narrow p-type local impurity region 6 is formed through the oblique ion-implantation.

Figure 8G:
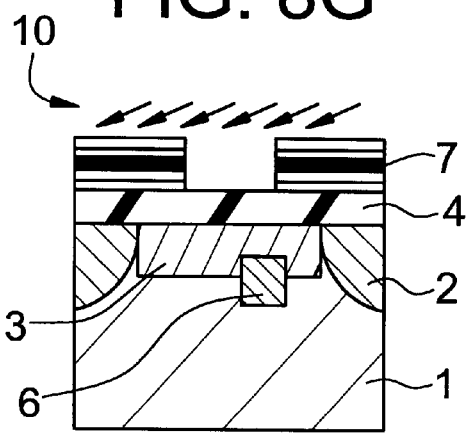

Subsequently, still another photo-resist ion-implantation mask 7 is patterned on the insulating layer 4, and the oblique ion-implantation is carried out at a different direction at dosage of $5 \times 10^{11}$ to $1 \times 10^{13}$ under the acceleration energy of 50 to 200 keV as shown in FIG. 8G. The direction of ion-implantation is 50 to 200 degrees with respect to the normal line. The p-type dopant impurity 10 forms the other p-type local impurity region 6 in the left portion of the central region of the n-type charge accumulating layer 3. The photo-resist ion-implantation mask 7 is stripped off, and the pair of p-type local impurity regions 6 are formed in the central region of the n-type charge accumulating layer 3 like stripes as shown in FIG. 8H.

As described hereinbefore, the p-type local impurity regions 6 are narrower than the opening of the photo-resist ion-implantation mask 7. If the opening has the minimum width patternable through the photo-lithography, each of the p-type local impurity regions 6 is narrower than the minimum pattern width, and the manufacturer can form the plural p-type local impurity regions 6 in the miniature unit cells less than 5 microns by using the oblique ion-implantation.

Conductive material is deposited over the entire surface of the resultant structure, and forms a conductive layer extending over the insulating layer 4. A photo-resist etching mask is patterned on the conductive layer through the photo-lithography, and an appropriate etchant selectively removes the conductive material from the conductive layer. As a result, the transfer electrodes 5 are left on the insulating layer 4 as shown in FIG. 8I.

As will be understood from the foregoing description, the n-type charge accumulating layer 3 is formed through the heavy doping, which is followed by the oblique ion-implantations with the p-type dopant impurity 10. This results in the heavily-doped peripheral regions of the n-type charge accumulating layer 3 and the p-n junctions penetrating into both of the central region and the n-type semiconductor substrate 1. The heavily-doped n-type peripheral regions and the p-n junctions increase the amount of signal charge accumulated in each unit cell, and restrict the pulse height of the pulse signal for the substrate shutter. Even though the n-type charge accumulating layer 3 is less than 5 microns in width, the pair of p-type local impurity regions 6 offers the p-n junction long enough to increase the amount of signal charge accumulated in each unit cell.

Moreover, the effective photo- electric converting region becomes deep, and the sensitivity is enhanced.

Although particular embodiments of the present invention have been shown and described, it will be apparent to those skilled in the art that various changes and modifications may be made without departing from the spirit and scope of the present invention.

For example, the p-type local impurity region or regions may be shaped in another configuration different from the stripe or stripes.

If the photo-resist ion-implantation mask 7 shown in FIG. 6E is replaced with another photo-resist ion-implantation mask with two parallel openings, the process for the charge coupled device shown in FIGS. 3A and 3B are available for the charge coupled device shown in FIGS. 4A and 4B.

The manufacturer may change the order of the steps shown in FIGS. 6A and 6B, the steps shown in FIGS. 6C and 6D and the steps shown in FIGS. 6E and 6F.

The manufacturer may change the order of the steps shown in FIGS. 7A and 7B, the steps shown in FIGS. 7C and 7D, the steps shown in FIGS. 7E and 7F and the steps shown in FIGS. 7G and 7H.

The manufacturer may change the order of the steps shown in FIGS. 8A and 8B, the steps shown in FIGS. 8C and 8D and the steps shown in FIGS. 8E, 8F, 8G and 8H.

The n-type dopant impurity and the p-type dopant impurity may be exchanged in still another process according to the present invention.

The dosage and the acceleration energy described in conjunction with the processes are appropriate on the assumption that the semiconductor substrate, the n-type dopant impurity and the p-type dopant impurity are a silicon substrate, phosphorous and boron. However, if the semiconductor substrate is, by way of example, formed of gallium arsenide or silicon carbide, different dopant impurities are used, and, accordingly, the conditions of ion-implantation are different. Thus, the process conditions are variable together with the material used for the substrate.

What is claimed is:

1. A charge coupled device fabricated on a semiconductor substrate of a first conductivity type, said charge coupled device comprising:
    isolating regions having a second conductivity type opposite to said first conductivity type, and spaced from each other in a surface portion of said semiconductor substrate;
    a charge accumulating layer of said first conductivity type formed in said surface portion between said isolating regions;
    an insulating layer formed on said isolating regions and said charge accumulating layer;
    transfer electrodes formed on said insulating layer along said charge accumulating layer; and
    a local impurity region of said second conductivity type formed in said semiconductor substrate, projecting into a central region of said charge accumulating layer for forming a p-n junction, and spaced from said isolating regions such that no portion of said local impurity region contacts said isolating regions.

2. The charge coupled device as set forth in claim 1, in which said charge accumulating layer is equal in width to or less than 5 microns.

3. The charge coupled device as set forth in claim 2, in which said local impurity region extends like a single stripe along said charge accumulating layer.

4. The charge coupled device as set forth in claim 3, in which said local impurity region has a width equal to or less than a half of the distance between said isolating regions.

5. The charge coupled device as set forth in claim 2, in which said local impurity region has plural local impurity sub- regions extending in parallel along said charge accumulating layer like stripes.

6. A charge coupled device comprising:
    a semiconductor substrate of a first conductivity type;
    isolating regions of a second conductivity type opposite to the first conductivity type, and separated from each other in a surface portion of said semiconductor substrate;
    a charge accumulating layer of the first conductivity type formed in said surface portion between said isolating regions, said charge accumulating layer comprising a central region, which is doped at $1 \times 10^{15}$ to $1 \times 10^{18}$ atoms/cm$^3$, and a peripheral region, which is doped at $1 \times 10^{15}$ to $1 \times 10^{18}$ atoms/cm$^3$;

an insulating layer formed on said isolating regions and said charge accumulating layer;

transfer electrodes formed on said insulating layer along said charge accumulating layer; and a local impurity region of the second conductivity type formed in said semiconductor substrate, and projecting into said central region of said charge accumulating layer for forming a p-n junction, wherein said local impurity region is narrower than said charge accumulating layer and thereby is separated from said isolating regions such that no portion of said local impurity region contacts said isolating regions, and wherein said local impurity region is doped at $1 \times 10^{15}$ to $1 \times 10^{17}$ atoms/cm$^3$.

* * * * *